United States Patent [19]

Miyafuji et al.

[11] Patent Number: 4,591,484

[45] Date of Patent: May 27, 1986

[54] LEAD MATERIALS FOR SEMICONDUCTOR DEVICES

[75] Inventors: Motohisa Miyafuji; Takashi Matsui; Hidekazu Harada, all of Shimonoseki, Japan

[73] Assignee: Kabushiki Kaisha Kobe Seiko Sho, Kobe, Japan

[21] Appl. No.: 719,453

[22] Filed: Apr. 3, 1985

[30] Foreign Application Priority Data

Apr. 7, 1984 [JP] Japan .................................. 59-69496

[51] Int. Cl.$^4$ ............................................... C22C 9/06
[52] U.S. Cl. .................................... 420/481; 420/485; 420/487; 420/494; 420/500
[58] Field of Search ............... 420/481, 487, 494, 485, 420/500; 148/11.5 C

[56] References Cited

U.S. PATENT DOCUMENTS

| | | | |
|---|---|---|---|
| 4,198,248 | 4/1980 | Mandigo et al. | 148/11.5 C |
| 4,337,089 | 6/1982 | Arita et al. | 148/11.5 C |
| 4,366,117 | 12/1982 | Tsuji | 420/481 |
| 4,430,298 | 2/1984 | Miyafuji et al. | 420/481 |

FOREIGN PATENT DOCUMENTS

| | | | |
|---|---|---|---|
| 89448 | 6/1982 | Japan | 420/494 |
| 116738 | 7/1982 | Japan | 420/485 |
| 109356 | 7/1982 | Japan | 420/485 |

*Primary Examiner*—L. Dewayne Rutledge
*Assistant Examiner*—Robert L. McDowell
*Attorney, Agent, or Firm*—Oblon, Fisher, Spivak, McClelland & Maier

[57] ABSTRACT

A lead material for semiconductor devices comprising from 0.4 to 4.0 wt % of Ni, from 0.1 to 1.0 wt % of Si, from 0.05 to 1.0 wt % of Zn, from 0.01 to 1.0 wt % of Mn, from 0.001 to less than 0.01 wt % of Mg, from 0.001 to less than 0.01 wt % of Cr, up to 0.003 wt % of S, and the balance of Cu and inevitable impurities. The material may further comprise up to 5 ppm of hydrogen and up to 5 ppm of oxygen.

2 Claims, No Drawings

LEAD MATERIALS FOR SEMICONDUCTOR DEVICES

BACKGROUND OF THE INVENTION

Field of the Invention

This invention relates to semiconductor devices and more particularly, to lead materials for use in semiconductor devices such as transistors, integrated circuits, and the like.

As is well known in the art, it is the usual practice to use, as lead materials for semiconductor devices, Fe-42%Ni which has a linear expansion coefficient close to the coefficients of elements and ceramic materials. This Fe-42%Ni alloy has such a large content of Ni that it is poorer in economy than copper alloys.

In the fabrication of integrated circuits, it is essential to attain high cost performance. Thus, inexpensive copper alloys have been studied and developed as a substitute for Fe-42%Ni. In fact, the problem of the thermal stress produced due to the difference in linear expansion coefficient between an element and a lead is now solved by techniques such as insertion of a thin sheet of tungsten or molybdenum as a cushioning medium, or use of solders or conductive resin adhesives. In addition, although expensive ceramics have been conventionally used as adhesives and sealed with glass, they are now replaced by inexpensive resins in order to save the cost. Resins are advantageous in that they have linear expansion coefficients close to the coefficients of copper alloys and show good affinity for the alloys.

As the degree of integration increases, Fe-42wt%Ni has to be so designed that a heat sink is provided in order to diffuse the Joule heat generated in an element. However, such a heat sink is not necessary for copper alloys.

As will be appreciated from the above, copper alloys have great advantages when used, instead of conventional Fe-42wt%Ni, as the lead material for semiconductor devices. It should be noted, however, that Fe-42wt%Ni is advantageous in that they have high strength, great elongation, and good heat resistance.

In general, lead materials for semiconductor devices should satisfy the requirements of high strength, good lead bend fatigue property, high stiffness, good heat and electrical conductivity, good corrosion resistance, good resistance to stress corrosion cracking, good solderability, good resistance to peeling of plated tin and solder, good platability of gold or silver, good stampability, and inexpensiveness.

Among copper alloys suitable as lead materials for semiconductor devices, Cu-Ni-Si alloys are considered as having mechanical properties and heat resistance almost same as Fe-42wt%Ni. However, the alloys are poorer in hot workability and is also disadvantageous in that plated tin or solder is peeled in several days when maintained at a temperature of 150° C. and that platability of gold or silver is worse.

SUMMARY OF THE INVENTION

It is an object of the invention to provide copper alloy lead materials for semiconductor devices which are more economical than known Fe-42wt%Ni and have characteristic properties comparable to the known alloy.

It is another object of the invention to provide copper alloy lead materials wich have good hot workability, high resistance to peeling of tin and solder, good solerability, and good platability of gold, silver or the like.

The above objects can be achieved, according to the invention, by a lead material for semiconductor devices which comprises from 0.4 to 4.0 wt% of Ni, from 0.1 to 1.0 wt% of Si, from 0.05 to 1.0 wt% of Zn, from 0.01 to 1.0 wt% of Mn, from 0.001 to less than 0.01 wt% of Mg, from 0.001 to less than 0.01 wt% of Cr, up to 0.003 wt% of S, and the balance of Cu and inevitable impurities. S in the material should preferably be in the form of compounds with Mg, typical of which is MgS. The material may further comprise up to 5 ppm of hydrogen and up to 5 ppm of oxygen.

DETAILED DESCRIPTION OF THE INVENTION

The components and amounts thereof contained in the lead materials according to the invention are described in detail.

Ni is an element which can improve mechanical strength. If the content of Ni is less than 0.4 wt%, the improvement cannot be expected even though Si is contained in the range of from 0.1 to 1.0 wt%. On the other hand, when the content exceeds 4.0 wt%, the workability becomes poor and the improvement of mechanical strength is not expected as much. Accordingly, the content of Ni is in the range of from 0.4 to 4.0 wt%.

Si is an element which serves to improve mechanical strength. Amounts less than 0.1 wt% are unfavorable because the improvement of the strength cannot be expected even when Ni is used in an amount of from 0.4 to 4.0 wt%. Also, high electrical conductivity cannot be imparted. When the content exceeds 1.0 wt%, the workability and electrical conductivity lower with a lowering of solderability. Accordingly, the content of Si is in the range of from 0.1 to 1.0 wt%.

Zn is an element which is essential for improving the resistance to peeling of tin and solder. This effects is not appreciable when the content is less than 0.05 wt%. When the content exceeds 1.0 wt%, the solderability lowers. Accordingly, the content of Zn is in the range of from 0.05 to 1.0 wt%.

Mn is an element which has the ability of cleaning a molten metal and can improve hot workability. However, when the content is less than 0.01 wt%, the hot workability cannot be improved. Over 1.0 wt%, electrical conductivity and solderability lower considerably. Accordingly, the content of Mn is in the range of from 0.01 to 1.0 wt%.

Mg is an element which is essential for ensuring good hot workability by fixing S into a stable Mg compound in the matrix phase. Amounts of 0.001 wt% or below are not favorable because S is not converted into stable MgS, but S exists as it is or in the form of MnS. S or MnS tends to move toward grain boundaries during heating for hot rolling or during the hot rolling, causing cracks to be produced. On the other hand, when the content exceeds 0.01 wt%, an eutectic mixture of $Cu+MgCu_2$ (having a melting point of 722° C.) is formed in an ingot. When the ingot is heated to a temperature over 722° C., it is cracked, the molten metal is oxidized, and the flowability of the molten metal lowers considerably. Thus, the ingot becomes unwholesome. Accordingly, the content of Mg is in the range of from 0.001 to less than 0.01 wt%.

Cr is an element which is essential for ensuring good hot workability. When the content is less than 0.001 wt%, the hot workability cannot be improved. Over 0.01 wt%, the molten metal is oxidized, and the flowability of the molten metal lowers. Thus, the ingot becomes unwholesome.

S is incorporated in the molten metal from various sources such as refractory materials for furnace conduits, fuels, and atmospheric gases. S exists in the molten metal as it is, or in the form of MnS, which are main factors of causing cracks by heating or by hot processing. Further, sulfur serves to lower wettability of solder and platability of noble metals. If the content exceeds 0.003 wt%, intergranular cracks are produced only by application of heat. If the content of S is not greater than 0.003 wt%, S and MnS can be converted into the most stable MgS because Mg is used in an amount of from 0.001 to below 0.01 wt%. Accordingly, the content of S should be up to 0.003 wt%.

The lead materials of the invention may further comprise hydrogen and oxygen. However, if hydrogen is contained in an amount exceeding 5 ppm, fine blisters are formed in the final product, so that the content of hydrogen is limited to 5 ppm or below. When the amount of oxygen exceeds 5 ppm, the platability of noble metals lowers and thus it becomes dificult to bond elements together. Accordingly, the content of oxygen is 5 ppm or below.

form of ingots, followed by subjecting to an X-ray microanalyzer to qualitatively analyze fine foreign matters. The presence of S in the foreign matters or therearounds, and the type of element coexisting with S were checked.

Moreover, samples were taken in a direction parallel to the rolling direction, and subjected to measurements of tensile strength and elongation using an E8 test piece prescribed in ASTM.

The solderability was assessed as follows: a test piece was immersed in a weakly active flux (alpha 611) by the vertical immersion method, and further immersed in 5 seconds in a solder bath of Sn60-Pb40 at a temperature of 230° C., followed by visually observing the wetting state of the solder.

The test of heat peelability of solder was conducted as follows: a soldered sample was maintained in an oven at 150° C. for 500 hours, and then bent at 90° to determine an adhesion of the solder.

The plate adhesion was conducted as follows: a 3 μm thick Ag layer was plated directly on a sample and heated at a temperature of 450° C. for 5 minutes, after which the number of blisters on the surface were observed through a magnifier of 10 magnifications.

The test results of the alloys of the invention and the comparative alloys are shown in Table 2.

TABLE 1

| No. | Constituents of Alloys (wt %) | | | | | | | | | |
|---|---|---|---|---|---|---|---|---|---|---|
|  | Cu | Ni | Si | Zn | Mn | Mg | S | H | O | Cr |
| Alloys of Invention: | | | | | | | | | | |
| 1 | balance | 0.94 | 0.24 | 0.30 | 0.90 | 0.008 | 0.0018 | 0.0004 | 0.0002 | 0.007 |
| 2 | balance | 1.56 | 0.33 | 0.06 | 0.02 | 0.005 | 0.0012 | 0.0003 | 0.0002 | 0.002 |
| 3 | balance | 2.32 | 0.48 | 0.05 | 0.84 | 0.004 | 0.0015 | 0.0003 | 0.0003 | 0.009 |
| 4 | balance | 3.16 | 0.67 | 0.34 | 0.04 | 0.003 | 0.0012 | 0.0002 | 0.0004 | 0.005 |
| 5 | balance | 3.92 | 0.85 | 0.96 | 0.03 | 0.009 | 0.0020 | 0.0005 | 0.0001 | 0.004 |
| Comparative Alloys: | | | | | | | | | | |
| 6 | balance | 3.20 | 0.71 | 0.01 | 0.05 | 0.000 | 0.0035 | 0.0005 | 0.0007 | 0.000 |
| 7 | balance | 3.23 | 0.68 | 1.21 | 0.00 | 0.008 | 0.0025 | 0.0008 | 0.0006 | 0.000 |
| 8 | balance | 3.31 | 0.73 | 0.32 | 1.21 | 0.013 | 0.0031 | 0.0004 | 0.0003 | 0.000 |
| 9 | balance | 3.18 | 0.70 | 0.03 | 0.00 | 0.000 | 0.0034 | 0.0007 | 0.0008 | 0.000 |
| 10 | balance | 3.21 | 0.69 | 1.12 | 0.17 | 0.003 | 0.0036 | 0.0008 | 0.0002 | 0.000 |

TABLE 2

| No. | Tensile strength (kgf/mm²) | Elongation (%) | Solderability | Resistance to heat peeling of solder | Number of blisters of silver plate* | Blister of sample | Form of S in alloy | Hot Workability |
|---|---|---|---|---|---|---|---|---|
| Alloys of the Invention: | | | | | | | | |
| 1 | 46 | 11.9 | good | good | 0 | no | MgS | good |
| 2 | 48 | 10.1 | good | good | 0 | no | MgS | good |
| 3 | 55 | 9.4 | good | good | 0 | no | MgS | good |
| 4 | 63 | 7.2 | good | good | 0 | no | MgS | good |
| 5 | 72 | 6.7 | good | good | 0 | no | MgS | good |
| 6 | 62 | 8.1 | bad | bad | 0.2 | no | MnS, S | impossible |
| 7 | 65 | 7.3 | bad | good | 0.1 | yes | MgS | impossible |
| 8 | 63 | 6.8 | bad | good | 0 | no | MgS | impossible |
| 9 | 62 | 7.9 | bad | bad | 0.3 | yes | MnS, S | impossible |
| 10 | 64 | 7.4 | bad | good | 0 | yes | MnS, S, MgS | impossible |

*Number of blisters/cm²

The present invention is described in more detail by way of example.

EXAMPLE

Alloys having constituents and amounts by percent indicated in Table 1 were each molten in a kryptle furnace in air while being coated with charcoal, thereby obtaining ingots having a thickness of 60 mm, a width of 60 mm, and a length of 180 mm.

Subsequently, micro samples were taken from the alloys of the invention and comparative alloys in the As will be clear from Table 2, the alloys of the invention have satisfactory tensile strength, resistance to heat peeling of solder, plate adhesion, and resistance to blister. The hot workability of the ingots in which S is all converted into compounds substantially consisting of MgS is good when the content of S is not greater than 0.003 wt%.

The differences between the alloy of the invention, e.g. alloy No. 4, and the comparative alloys are particularly discussed.

Comparative alloy 6 contains 0.0035 wt% of S but is free of Mg, so that MnS and S exist undersirably, the hot rolling is impossible, and the solderability is bad. In addition, because the content of Zn is as small as 0.01 wt%, the solder peels off when the sample is maintained at a temperature of 150° C. for 48 hours, and the plated silver is blistered.

Because comparative alloy 7 is free of Mn and Cr, the hot rolling is impossible. A number of sesame seed-like blisters are observed on the surface of the final product since hydrogen is contained in an amount of 8 ppm. The solderability is not good because the content of Zn is as great as 1.21 wt%. Moreover, the plated silver is blistered after heating. This is because of the content of oxygen as high as 6 ppm.

Comparative alloy 8 has such a large content of Mg as 0.013 wt%, with poor casting skin. The hot workability is impossible. Because Mn is contained in an amount of 1.21 wt%, the solderability is not good.

Comparative alloy 9 has a S content of 0.0034 wt% and is free of Mg, so that MnS and S exist in the ingot. Accordingly, the hot workability is impossible, and the sheet made by cold processing has poor solderability.

The content of Zn is as small as 0.03 wt%, with the result that the solder peels off within a short time. On the other hand, because the content of hydrogen is as great as 7 ppm, the material itself is blistered. The content of oxygen is so great that the plated silver involves blisters.

Because comparative alloy 10 has a content of S of 0.0036 wt% but a content of Mg is as small as 0.003 wt%, MgS, S, and MnS are all present in the alloy. MnS and S are contained in such large amounts that the hot workability is impossible in spite of the fact that Mn is contained in an amount of 0.17 wt%. The ingot involves blisters since the content of hydrogen is as high as 8 ppm.

What is claimed is:

1. A lead material for semiconductor devices comprising from 0.4 to 4.0 wt% of Ni, from 0.1 to 1.0 wt% of Si, from 0.05 to 1.0 wt% of Zn, from 0.01 to 1.0 wt% of Mn, from 0.001 to less than 0.01 wt% of Mg, from 0.001 to less than 0.01 wt% of Cr, up to 0.003 wt% of S, up to 5 ppm of hydrogen, up to 5 ppm of oxygen, and the balance Cu and inevitable impurities.

2. The lead material according to claim 1, wherein S is substantially in the form of MgS.

* * * * *